United States Patent
Gopalakrishnan et al.

(10) Patent No.: US 6,855,670 B1
(45) Date of Patent: Feb. 15, 2005

(54) SUPERCONDUCTING BISMUTH-STRONTIUM-CALCIUM-COPPER OXIDE COMPOSITIONS AND PROCESS FOR MANUFACTURE

(75) Inventors: Jagannatha Gopalakrishnan, Wilmington, DE (US); Arthur William Sleight, Kennett Square, PA (US); Munirpallam Appadorai Subramanian, New Castle, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 1826 days.

(21) Appl. No.: 07/528,270

(22) Filed: May 24, 1990

Related U.S. Application Data

(63) Continuation of application No. 07/153,107, filed on Feb. 8, 1988, now abandoned, which is a continuation-in-part of application No. 07/152,186, filed on Feb. 4, 1988, now abandoned.

(51) Int. Cl.⁷ ................... C04B 101/00; H01B 12/00; H01L 39/12
(52) U.S. Cl. ................... 505/121; 505/501; 505/782
(58) Field of Search ................... 505/1, 782, 121, 505/450, 501

(56) References Cited

U.S. PATENT DOCUMENTS

| | | | | |
|---|---|---|---|---|
| 4,049,789 A | * | 9/1977 | Manabe et al. | 423/593 |
| 4,482,644 A | * | 11/1984 | Beyerlein et al. | 502/303 |
| 4,567,031 A | * | 1/1986 | Riley | 423/593 |
| 4,643,984 A | * | 2/1987 | Abe et al. | 501/134 |

OTHER PUBLICATIONS

Maeda et al. "A New High–Tc Oxide Superconductor w/o a Rare Element " *Jap. J. App. Phy*, 27 (2) Feb. 1988 pp. L209–L210.*

Akimitsu et al. "Superconductivity in the Bi–SiCu O System" *Jap. J. App. Phy*, 26(12) Dec. 1987 pp. L2080–L2081.*
Dagani "New Class of Superconductors Discovered" *Chemical & Engineering News* 66(5) Feb. 1, 1988 p. 5.*
Maeda, H., et al. "A New High $T_c$ Oxide Superconductor Without Rare Earth Element", Preprint Received by IBM on Jan. 29, 1989.*
"Superconductivity in the Very High $T_c$ Bi–Ca–Sr–Cu–O System: Phase Identification", Hazen et al. (Preprint).
Bednorz and Muller, Z. Phys. B64, 189 (1986).
Wu et al., Phys., Rev. Lett. 58, 908 (1987).
C. Michael et al., Z. Phys. B—Condensed Matter 68, 417 (1987).
C. Michael et al., Z. Phys. B—Condensed Matter 68, 421 (1987).
Kishio et al., High–$T_c$ Superconducting Oxide Solid Solutions $(La_{1-x}(Ba_1Sr_1Ca)_x)_2Cu\ O_{4-\delta}$, Chemistry Letters, pp. 635–638 (1987).
Bednorz et al., Superconductivity in Alkaline Earth–Substituted $La_2Cu\ O_{4-y}$, Science, vol. 236, pp. 73–75, (1987).
Doss, Engineer's Guide to High–Temperature Superconductivity, John Wiley and Sons, pp. 149 and 154 (1989).

* cited by examiner

*Primary Examiner*—Mark Kopec

(57) ABSTRACT

Compositions having the nominal formula $$Bi_a Sr_b Ca_c Cu_3 O_x$$

wherein a is from about 1 to 3,
  b is from about 3/8 to 4,
  c is from about 3/16 to 2,
  x=(1.5 a+b+c+y) where
y is from about 2 to 5, with the proviso
that "b+c" is from about 3/2 to 5, containing a metal oxide phase of the formula $Bi_2Sr_{3-z}Ca_zCu_2O_{8+w}$
wherein z is from about 0.1 to 0.9
  w is greater than zero but less than 1, are superconducting. Processes for manufacturing such compositions and for using them are disclosed.

3 Claims, No Drawings

SUPERCONDUCTING BISMUTH-STRONTIUM-CALCIUM-COPPER OXIDE COMPOSITIONS AND PROCESS FOR MANUFACTURE

CROSS-REFERENCES TO RELATED APPLICATION

This application is a continuation-in-part application of Serial No. (CR-8641) filed on Feb. 4, 1988.

RELATED APPLICATION

Application Ser. No. 07/153,107, filed Feb. 8, 1988 is a Continuation-in-Part of U.S. patent application Ser. No. 07/152,186, filed Feb. 4, 1988 now abandoned.

This application is a continuation, Ser. No. 07/153,107 filed Feb. 8, 1988 now abandoned.

BACKGROUND OF THE INVENTION

Field of the Invention

This invention relates to novel bismuth-strontium-calcium-copper oxide compositions which are superconducting and to a process for making them.

References

Bednorz and Muller, Z. Phys. B64, 189 (1986), disclose a superconducting phase in the La-Ba-Cu-O system with a superconducting transition temperature of about 35 K. This disclosure was subsequently confirmed by a number of investigators [see, for example, Rao and Ganguly, Current Science, 56, 47 (1987), Chu et al., Science 235, 567 (1987), Chu et al., Phys. Rev. Lett. 58, 405 (1987), Cava et al., Phys. Rev. Lett. 58, 408 (1987), Bednorz et al., Europhys. Lett. 3, 379 (1987)]. The superconducting phase has been identified as the composition $La_{1-x}(Ba, Sr, Ca)_xCuO_{4-y}$ with the tetragonal $K_2NiF_4$-type structure and with x typically about 0.15 and y indicating oxygen vacancies.

Wu et al., Phys. Rev. Lett. 58, 908 (1987), disclose a superconducting phase in the Y-Ba-Cu-O system with a superconducting transition temperature of about 90 K. Cava et al., Phys. Rev. Lett. 58, 1676 (1987), have identified this superconducting Y-Ba-Cu-O phase to be orthorhombic, distorted, oxygen-deficient perovskite $YBa_2Cu_3O_{9-\delta}$ where $\delta$ is about 2.1 and present the powder x-ray diffraction pattern and lattice parameters.

C. Michel et al., Z. Phys. B-Condensed Matter 68, 417 (1987), disclose the introduction of Bi into the superconductor $La_{2-x}Sr_xCuO_{4-y}$, to form the oxides $La_{2-x}Bi_x$, $Sr_{x-x'}$, $CuO_{4-y}$. The study was limited to compositions corresponding to the range where superconductivity was mainly observed, x-x'=0.1-0.2. Single phases were obtained when x≦3 and x'≦2. One sample of composition $La_{1.7}Bi_{0.1}Sr_{0.2}CuO_{4-y}$ has a superconducting transition temperature of about 42 K as determined from resistivity measurements as compared with about 38 K for $La_{1.8}Sr_{0.2}CuO_{4-y}$.

C. Michel et al., Z. Phys. B-Condensed Matter 68, 421 (1987), disclose a novel family of superconducting oxides in the Bi-Sr-Cu-O system with composition close to $Bi_2Sr_2Cu_2O_{7+6}$. A pure phase was isolated for the composition $Bi_2Sr_2Cu_2O_{7+6}$. The X-ray diffraction pattern for this material exhibits some similarity with that of perovskite and the electron diffraction, pattern shows the perovskite subcell with the orthorhombic cell parameters of a=5.32 A (0.532 nm), b=26.6 A (2.66 nm) and c=48.8 A (4.88 nm). The material made from ultrapure oxides has a superconducting transition with a midpoint of 22 K as determined from resistivity measurements and zero resistance below 14 K. The material made from commercial grade oxides has a superconducting transition with a midpoint of 7 K.

SUMMARY OF THE INVENTION

This invention provides novel superconducting compositions having the nominal formula $Bi_aSr_bCa_cCu_3O_x$ wherein a is from about 1 to about 2, b is from about ⅜ to about 4, c is from about ¾ to about 2 and x=(1.5a+b+c+y) where y is from about 2 to about 5, with the proviso that b+c is from about ½ to about 5, said compositions having superconducting transition temperatures of about 70 K or higher. Preferably, a is from about ½ to about 2, b is from about ½ to about 4, c is from about 1 to about ½ and b+c is about 3–5. The superconducting transition temperature of the preferred composition will be from at least 77 K (liquid nitrogen) up to about 115 K.

This invention also comprises a definition of the metal oxide phases that provides superconductivity for the composition of the nominal formula previously given. Specifically, this metal oxide phase has the formula

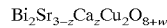

wherein z is from about 0.1 to about 0.9, preferably 0.4 to 0.8 and most preferably 0.6 to 0.7; and w is greater than zero but less than about 1.

Thus, the nominal formula for these superconducting compositions that contain substantial amounts of the above-mentioned metal oxide phase that provides superconductivity becomes $Bi_aSr_bCa_cCu_3O_x$ wherein a is from about 1 to about 3, b is from about ⅜ to about 4, c is from about 3/16 to about 2 and x=(1.5a+b+c+y) where y is from about 2 to about 5, with the proviso that b+c is from about ½ to about 5.

This invention also provides a process for making these compositions, the process consisting essentially of heating a mixture comprised of stoichiometric quantities of the metal oxides, for example, $Bi_2O_3$, SrO or $SrO_2$, CaO, and CuO, or precursors of the metal oxides, e.g., carbonates such as $CaCO_3$, nitrates such as $Sr(NO_3)_2$, etc. at about 775° C. to about 900° C. for about 8 to about 48 hours or more in air. Preferred are heating temperatures of about 850° C. to about 900° C.

DETAILED DESCRIPTION OF THE INVENTION

The superconducting compositions of this invention have the nominal formula $Bi_aSr_bCa_cCu_3O_x$ wherein a is from about 1 to about 3, b is from about ⅜ to about 4, c is from about 3/16 to about 2 and x=(1.5 a+b+c+y) where y is from about 2 to about 5, with the proviso that b+c is from about ½ to about 5. These compositions have superconducting transition temperatures of at least 70 K up to about 120 K. Preferred are the compositions wherein a is from about ½ to about 3, b is from about ½ to about 4, c is from about ½ to about ½ and b+c is about 3–5. These preferred compositions have superconducting transition temperatures above 77 K, the temperature of liquid nitrogen.

The superconducting $Bi_aSr_bCa_cCu_3O_x$ compositions can be prepared by the following process. Stoichiometric quantities of $Bi_2O_3$, SrO, CaO, and CuO are mixed, for example, by grinding them together in a mortar. Precursors of the oxides such as carbonates can be substituted for one or more of the oxides. Alternatively, an intimate stoichiometric mixture of precursors of the oxides can be prepared from a solution of precursors such as nitrates or acetates, either by precipitation from such a solution or by drying such a solution by evaporation of the solvent or by spray- or freeze-drying. The mixture of oxides or precursors in the form of a powder or a pressed pellet is then placed in a container made of a non-reactive material such as alumina or gold. The container is then placed in a furnace and heated at about 775° C. to about 900° C. for about 8 to about 48 hours in air, preferably from about 850° C. to about 900° C. The superconducting transition temperature is generally higher if the heating temperature is in the preferred range. Melting should be avoided. Since melting occurs at heating temperatures of about 900° C. and higher, reaction must occur below these temperatures.

Cooling can be done slowly by either turning off the power to the furnace and allowing the container to furnace-cool or by programming the furnace to cool at a slow rate, e.g., at 2° C. per minute. When the temperature is below 100° C., e.g. ambient temperature (about 20° C.) the container is removed from the furnace and the black crystalline product is recovered. Cooling can also be accomplished by quenching at ambient temperature the material which had been heated to 850–900° C.

A superconducting $Bi_aSr_bCa_cCu_3O_x$ composition can be produced even when the relative amounts of reactants are chosen outside of the stoichiomeric limits dictated by the ranges enumerated above for a, b and c. The superconducting composition would then be composed of at least one superconducting phase along with other non-superconducting phases.

Superconductivity can be confirmed by observing magnetic flux exclusion, i.e., the, Meissner effect. This effect can be measured by the method described in an article by E. Polturak and B. Fisher in Physical Review B, 36, 5586 (1987).

The superconducting compositions of this invention can be used to conduct current extremely efficiently or to provide a magnetic field for magnetic imaging for medical purposes. Thus, by cooling the composition in the form of a wire or bar to a temperature below the superconducting transition temperature, e.g., at or below about 115 K, preferably at or below about 85 K, byi exposing the material to liquid nitrogen in a manner well known to those in this field; and initiating a flow of electrical current, one can obtain such flow without any electrical resistive losses. To provide exceptionally high magnetic fields with minimal power losses, the wire mentioned previously could be wound to form a coil which would be exposed to liquid helium before inducing any current into the coil. The superconducting compositions of this invention can also be used to provide diamagnetic fields that are extremely persistent. Such fields are obtained by exposing the compositions in the form of a sheet or similar construction to an external magnetic field, the sheet being cooled to a temperature below the superconducting transition temperature, e.g. cooled to between 77 K and 115 K, by exposure to liquid nitrogen. Such fields can be used to levitate objects as large as railroad cars. These superconducting compositions are also useful in Josephson devices such as SQUIDS (superconducting quantum interferences devices) and in instruments that are based on the Josephson effect such as high speed sampling circuits and voltage standards. These compositions appear to be more stable, especially in the presence ofwater, than prior superconductive compositions having transition temperatures in the same range. The compositions are also more easily processed than prior art compositions.

EXAMPLES OF THE INVENTION

Example 1

A compositon of nominal formula $BiSrCaCu_3O_x$ was prepared in the following manner. $Bi_2O_3$ (2.3298 g), $SrO_2$ (1.1692 g), $CaCO_3$ (1.0009 g) and CuO (2.3862 g) were mixed and ground together in an agate mortar for thirty minutes. The powder was placed in an alumina container and the container placed in a furnace and heated in air at a rate of 10° C. per minute to 800° C. and then held at 800° C. for 12 hours. The power was then turned off and the furnace allowed to cool to a temperature below about 100° C. before the container was removed. The black crystalline product was recovered.

Measurement of the Meissner effect showed the powder product to have an onset of superconductivity at about 75 K.

Example 2

A compositon of nominal formula $Bi_{3/2}Sr_{3/2}Ca_{3/2}Cu_3O_x$ was prepared in the following manner. $Bi_2O_3$ (4.6596 g), $SrO_2$ (2.3924 g), $CaCO_3$ (2.0018 g) and CuO (3.1816 g) were mixed and ground together in an agate mortar for thirty minutes. The powder was placed in an alumina container and the container placed in a furnace and heated in air at a rate of 10° C. per minute to 800° C. and then held at 800° C. for 12 hours. The power was then turned off and the furnace allowed to cool to a temperature below about 100° C. before the container was removed. The black crystalline product was recovered.

Measurement of the Meissner effect showed the powder product to have an onset of superconductivity at about 75 K.

Examples 3A and 3B

A compositon of nominal formula $Bi_2Sr_2 CaCu_3 O_x$ was prepared in the following manner. $Bi_2O_3$ (4.6596 g), $SrO_2$ (2.3924 g), $CaCO_3$ (1.0009 g) and CuO (2.3865 g) were mixed and ground together in an agate mortar for thirty minutes. The powder mixture was used to press 10 pellets, each 10 mm in diameter and about 2 mm thick.

In Example 3A, the pressed pellet was placed on an alumina tray and the tray placed in a furnace and heated in air at a rate of 10° C. per minute to 800° C. and then held at 800° C. for 8 hours. The power was then turned off and the furnace allowed to cool to a temperature below about 100° C. before the tray was removed. The black crystalline product was recovered.

Measurement of the Meissner effect showed the pellet to have an onset of superconductivity at about 83 K.

In Example 3B, another pressed pellet was placed on an alumina tray and the tray placed in a furnace and heated in air at a rate of 10° C. per minute to 900° C. and then held at 900° C. for 8 hours. The furnace was then cooled at the rate of 2° C. per minute to a temperature below about 100° C. before the tray was removed. The black crystalline product was recovered.

Measurement of the Meissner effect showed the pellet to have an onset of superconductivity at about 85 K.

Examples 4A and 4B

A compositon of nominal formula $BiSrCa_2Cu_3O_x$ was prepared in the following manner. $Bi_2O_3$ (2.3298 g), $SrO_2$ (1.1962 g), $CaCO_3$ (2.0018 g) and CuO (2.3865 g) were mixed and ground together in an agate mortar for thirty minutes. The powder mixture was used to press 10 pellets, each 10 mm in diameter and about 2 mm thick.

In Example 4A, the pressed pellet was placed on an alumina tray and the tray placed in a furnace and heated in air at a rate of 10° C. per minute to 800° C. and then held at 800° C. for 8 hours. The power was then turned off and the furnace allowed to cool to a temperature below about 100° C. before the tray was removed. The black crystalline product was recovered.

Measurement of the Meissner effect showed the pellet to have an onset of superconductivity at about 75 K.

In Example 4B, another pressed pellet was placed on an alumina tray and the tray placed in a furnace and heated in air at a rate of 10° C. per minute to 900° C. and then held at 900° C. for 8 hours. The furnace was then cooled at the rate of 2° C. per minute to a temperature below about 106° C. before the tray was removed. The black crystalline product was recovered.

Measurement of the Meissner effect, showed the pellet to have an onset of superconductivity at about 75 K.

Example 5

A compositon of nominal formula $Bi_2 SrCaCu_3O_x$ was prepared in the following manner. $Bi_2O_3$ (2.3298 g), $SrO_2$ (0.5981 g), $CaCO_3$ (0.5005 g) and CuO (1.1933 g) were mixed and ground together in an agate mortar for thirty minutes. The powder mixture was used to press 10 pellets, each 10 mm in diameter and about 2 mm thick.

One of the pressed pellets was placed on an alumina tray and the tray placed in a furnace and heated in air at a rate of 10° C. per minute to 800° C. and then held at 800° C. for 8 hours. The power was then turned off and the furnace allowed to cool to a temperature below about 100° C. before the tray was removed. The black crystalline product was recovered.

Measurement of the Meissner effect showed the pellet to have an onset of superconductivity at about 72 K.

Examples 6A and 6B

A compositon of nominal formula $Bi_{3/2} Sr_{3/2}Ca_{3/2} Cu_3O_x$ was prepared in the following manner. $Bi_2O_3$ (2.3298 g), $Sr(NO_3)_2$ (2.1163 g), $CaCO_3$ (1.0009 g) and CuO (1.5910 g) were mixed and ground together in an agate mortar for thirty minutes. The powder mixture was used to press 10 pellets, each 10 mm in diameter and about 2 mm thick.

In Example 6A, the pressed pellet was placed on an alumina tray and the tray placed in a furnace and heated in air at a rate of 10° C. per minute to 800° C. and then held at 800° C. for 30 hours. The power was then turned off and the furnace allowed to cool to a temperature below about 100° C. before the tray was removed. The black crystalline product was recovered.

Measurement of the Meissner effect showed the pellet to have an onset of superconductivity at a temperature below 77 K. This is consistent with the results found in Example 2.

In Example 6B, another pressed pellet was placed on an alumina tray and the tray placed in a furnace and heated in air at a rate of 10° C. per minute to 850° C. and then held at 850° C. for 12 hours. The power was then turned off and the furnace allowed to cool to a temperature below about 100° C. before the tray was removed. The black crystalline product was recovered.

Measurement of the Meissner effect showed the pellet to have an onset of superconductivity at about 85 K.

EXAMPLE 7

A compositon of nominal formula $Bi_{3/2}Sr_{3/4}Ca_{3/4}Cu_3O_x$ was prepared in the following manner. $Bi_2O_3$ (4.6596 g), $SrO_2$ (1.1962 g), $CaCO_3$ (1.0009 g) and CuO (3.1816 g) were mixed and ground together in an agate mortar for thirty minutes. The powder was placed in an alumina container and the container placed in a furnace and heated in air at a rate of 10° C. per minute to 850° C. and then held at 850° C. for 12 hours. The power was then turned off and the furnace allowed to cool to a temperature below about 100° C. before the container was removed. The black crystalline product was recovered.

Measurement of the Meissner effect showed the powder product to have an onset of superconductivity atabout 70 K.

Example 8

A compositon of nominal formula $Bi_{3/2} Sr_{3/8}Ca_{9/8} Cu_3O_x$ was prepared in the following manner. $Bi_2O_3$ (4.6596 g), $SrO_2$ (0.5981 g), $CaCO_3$ (1.5014 g) and CuO (3.1816 g) were mixed and ground together in an agate mortar for thirty minutes. The powder was placed in an alumina container and the container placed in a furnace and heated in air at a rate of 10° C. per minute to 850° C. and then held at 850° C. for 12 hours. The power was then turned off and the furnace allowed to cool to a temperature below about 100° C. before the container was removed. The black crystalline product was recovered.

Measurement of the Meissner effect showed the powder product to have an onset of superconductivity at about 70 K.

EXAMPLE 9

A compositon of nominal formula $Bi_{3/2}Sr_{3/2}Ca_{3/2}Cu_3O_x$ was prepared in the following manner. $Bi_2O_3$ (4.6596 g), $SrO_2$ (2.3924 g), $CaCO_3$ (2.0018 g) and CuO (3.1816 g) were mixed and ground together in an agate mortar for thirty minutes. The powder mixture was used to press 10 pellets, each 10 mm in diameter and about 2 mm thick. One of the pressed pellets was placed on a gold tray and the tray placed in a furnace and heated in air at a rate of 10° C. per minute to 850° C. and then held at 850° C. for 48 hours. The pellet was then removed from the furnace, quenched in air and the black crystalline product recovered.

Measurement of the Meissner effect showed the product to have an onset of superconductivity at about 115 K.

EXAMPLE 10

A compositon of nominal formula $Bi_2Sr_2 CaCu_3O_x$ was prepared in the following manner. $Bi_2O_3$ (4.6596 g), $SrO_2$ (2.3924 g), $CaCO_3$ (1.0009 g) and CuO (2.3865 g) were mixed and ground together in an agate mortar for thirty minutes. The powder mixture was used to press 10 pellets, each 10 mm in diameter and about 2 mm thick.

One of the pressed pellets was placed on a gold tray and the tray placed in a furnace and heated in air at a rate of 10° C. per minute to 850° C. and then held at 850° C. for 48 hours. The pellet was then removed from the furnace, quenched in air and the black crystalline product recovered.

Measurement of the Meissner effect showed the product to have an onset of superconductivity at about 115 K.

Example 11

A compositon of nominal formula $Bi_3 Sr_3 CaCu_3O_x$ was prepared in the following manner. $Bi_2O_3$ (4.6596 g), $SrO_2$ (2.3924 g), $CaCO_3$ (0.6800 g) and CuO (1.5910 g) were mixed and ground together in an agate mortar for thirty minutes. The powder mixture was used to press 10 pellets, each 10 mm in diameter and about 2 mm thick.

As in Example 3A, the pressed pellet was placed on an alumina tray and the tray placed in a furnace and heated in air at a rate of 10° C. per minute to 800° C. and then held at 800° C. for 8 hours. The power was then turned off and the furnace allowed to cool to a temperature below about 100° C. before the tray was removed. The black crystalline product was recovered.

Measurement of the Meissner effect showed the pellet to have an onset of superconductivity at about 72 K.

Example 12

A compositon of nominal formula $Bi_2Sr_2CaCu_3O_x$ was prepared in the following manner. $Bi_2O_3$ (4.6596 g), $SrO_2$ (2.3924 g), $CaCO_3$ (1.0009 g) and CuO (2.3865 g) were mixed and ground together in an agate mortar for thirty minutes. The powder mixture was used to press 10 pellets, each 10 mm in diameter and about 2 mm thick.

One of the pressed pellets was placed on a gold tray and the tray placed in a furnace and heated in air at a rate of 10° C. per minute to 875° C. and then held at 875° C. for 36 hours. The furnance was then cooled at the rate of 1° C. per minute to a temperature below about 100° C. before the tray was removed.

Plate-like crystals which exhibited cleavage in the basal plane were predominant in the melt. They were mechanically separated and used for further characterization and structure determination. Both flux exclusion and electrical resistivity measurement on the single crystals revealed a sharp superconducting transition at $T_c$ of about 95 K. The superconducting metal oxide phase of this composition was identified as $$Bi_2Sr_{3-z}Ca_zCu_2O_{8+w}$$

where "z" was about 0.65 and "w" was less than 1 but greater than zero. The structure based on an A-centered orthorhombic cell with a=5.409 Å, b=5.414 Å and c=30.914 Å was determined by using single crystal x-ray diffraction data.

The structure was made up of alternating double copper-oxygen sheets and double bismuth-oxygen sheets. There were $Ca^{2+}$ and $Sr^{2+}$ cations between the adjacent Cu-O sheets; Sr cations were also found between the Cu-O and Bi-O sheets. High resolution transmission electron microscopy studies showed that the b axis is actually 27.07 Å, an increase of a factor of five over the subcell dimension. This superstructure can also be observed by x-ray diffraction on single crystals but twinning can make it appear that the superstructure is along both the a and b axes.

It should be understood that when "z" in the formula for the metal oxide superconducting phase is anywhere from about 0.1 to 0.9, "a" and "b" are both about 5.4 Å and "c" is about 31 Å, while $\alpha,\beta$ and $\gamma$ (the angles associated with the unit cell as known to those skilled in the art) are about 90°. Furthermore, as shown in this example, one or two of the subcell dimensions (a or b or c) can be multiplied by an integer of from about 2 to about 10 to obtain a cell exhibiting the superstructure of the superconducting phase of this invention.

The invention being claimed is:

1. A superconducting phase of the formula $$Bi_2Sr_{3-z}Ca_zCu_2O_{8+w}$$

wherein "z" is from about 0.4 to about 0.8, and w is a value greater than zero and less than 1.

2. A superconducting phase as in claim 1 wherein "z" is 0.6 to 0.7 having a structure based on an A-centered orthorhombic cell with a=5.409 Å and c=30.91 Å.

3. A process for making the superconducting composition of claim 1 comprising and grinding stoichiometric quantities of $Bi_2O_3$, $SrO_2$, $CaCO_3$ and CuO to provide a powder mixture wherein Bi, Sr, Ca and Cu are present in an atomic ratio of Bi:Sr:Ca:Cu: of 2:2:1:3, pressing said powder mixture a into pellets, heating said pellets in air at about 875° C., allowing said pellets to cool, and removing plate-like crystals from said pellets, thereby obtaining the superconducting composition of claim 1.

* * * * *